United States Patent
Quirk et al.

(12)

(10) Patent No.: US 6,307,565 B1
(45) Date of Patent: Oct. 23, 2001

(54) SYSTEM FOR DUAL BUFFERING OF ASYNCHRONOUS INPUT TO DUAL PORT MEMORY FOR A RASTER SCANNED DISPLAY

(75) Inventors: Robert John Quirk, Glendale; William Ray Hancock, Phoenix, both of AZ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/220,234

(22) Filed: Dec. 23, 1998

(51) Int. Cl.[7] .......................................................... G09G 5/36
(52) U.S. Cl. ...................... 345/554; 345/539; 365/230.05
(58) Field of Search ..................................... 345/539, 545, 345/554, 564; 365/230.05, 230.01, 184.01, 189.04, 230.03, 230.04

(56) References Cited

U.S. PATENT DOCUMENTS

| 5,130,979 | 7/1992 | Ohtawa | 370/67 |
| 5,247,485 | 9/1993 | Ide | 365/230.01 |
| 5,255,220 | 10/1993 | Filliman | 365/189.04 |
| 5,914,711 | * 6/1999 | Mangerson et al. | 345/203 |

* cited by examiner

Primary Examiner—Kee M. Tung

(57) ABSTRACT

A system which utilizes two buffers of dual-port memory to seamlessly display video frames on a raster scanned video display device. Dual port memory is organized into two alternate memory banks, each having sufficient capacity to buffer a full frame of video data. As long as the display memory write and read addresses are sufficiently separated by a predetermined number of lines, video data is written and read using alternate banks of memory for each frame. When the write and read addresses are closer than a predetermined number of lines, the video data already stored in a given bank of memory is re-read. After the write and read addresses are again sufficiently separated, video data is again written and read using alternate banks of memory.

9 Claims, 3 Drawing Sheets

SYSTEM FOR DUAL BUFFERING OF ASYNCHRONOUS INPUT TO DUAL PORT MEMORY FOR A RASTER SCANNED DISPLAY

FIELD OF THE INVENTION

This system relates generally to memory for raster-scanned displays and, in particular, to a system for controlling the reading from and writing to memory used as a buffer for asynchronously received digital video data to be displayed on an LCD display.

PROBLEM

Typically, a raster scanned display is synchronized to the incoming digital video to be displayed. When digital video is received for display on a raster scanned display device asynchronously with respect to the display frame read rate, the incoming video must be buffered. The video can then be read out of the buffer synchronously with respect to the display. The types of memory schemes typically employed for this buffering are described below, including dual-port memory, 'ping-pong' memory, and 'ping-pong-pong' memory configurations.

A dual-port (RAM) memory allows the simultaneous writing and reading of data. Dual-port memories simplify many data buffering schemes in that they do not require the complex multiplexing of address and data buses needed by memory configurations such as the 'ping-pong' and 'ping-pong-pong' buffering schemes (described below). However, in a typical system which uses a raster scanned display, such as an LCD display, the incoming video signal is asynchronous with respect to the LCD frame read rate. Therefore, absent some method of compensating for the difference in the read and write rates, the write and read addresses in LCD memory must eventually cross each other. This crossover will occur because the incoming video data is filling a raster scanned video frame either faster or more slowly than the LCD frame display rate. When such address crossover occurs, the LCD will display part of the new incoming video frame and part of the last incoming video frame. When the video image contains motion, this split becomes visible on the display, since part of the screen shows a segment of the image in the prior frame, and part of the screen shows a segment of the current image, which typically has moved relative to the prior frame. If the incoming video frame rate is close to the displayed frame rate, this frame split can remain static on the LCD for many frames or slowly move across the screen. Such a frame split may cause the LCD display image to be significantly degraded in real-time applications such as flight navigation or monitoring of other time-critical functions.

A 'ping-pong' memory allows data to be written to a 'ping' buffer while data is read from a 'pong' buffer. At the completion of each frame, the 'ping' and 'pong' buffers are swapped. One of the problems with using this system with asynchronous reads and writes is similar in effect to that of a dual-port memory configuration. Since the incoming video frame is not matched to the LCD video read-out, the buffer swapping will cause part of an old frame to be displayed at the same time that part of a new frame is being displayed.

Similar to the 'ping-pong' memory arrangement described above, a 'ping-pong-pong'buffering scheme allows data to be written to a 'ping' buffer while data is read from either of two 'pong' buffers. When either the write or read operations are complete for a given frame, the operations then proceed to use the idle buffer for the next frame. This prevents the write and read addresses from ever crossing. Problems with this scheme include the added expense of having three banks of full field memory, the increased circuit board area used and the difficulty of multiplexing the address and data buses between the video input and output and the three banks of memory.

SOLUTION

The above problems of address crossover, address and data multiplexing, as well as added cost and circuit board area are resolved by the system of the present invention, which utilizes a dual-port 'ping-pong' (dual buffer) memory configuration to buffer digital video received for display on a raster scanned screen asynchronously with respect to the screen display rate. In accordance with the present invention, the incoming video is switched between 'ping' and 'pong' buffers for each successive incoming frame of video data. The video output to the raster scanned display is also switched between the 'ping' and 'pong' buffers for each video frame, provided the address locations of the incoming video being written and the output video being read are sufficiently far apart. If the address locations are closer than a minimum number of display lines, the video output does not switch buffers but repeats the display read operation from the same buffer again. In this way, the write and read addresses are separated by an entire bank of memory and never cross. Assuming that the incoming video data rate is not exactly the same as the scanned display rate, the addresses will again creep closer together and eventually a frame read operation will need to be repeated.

BRIEF DESCRIPTION OF THE DRAWING

The system of the present invention may be better understood from a reading of the following description thereof taken in conjunction with the drawing in which.

DETAILED DESCRIPTION

Definitions

For the purpose of this disclosure, the following definitions are applicable to the present invention as described and claimed:

The term 'frame' 112 refers to the data comprising the composite of all lines to be displayed on a given LCD display;

'LCD frame' refers to a frame from which video data is read to the LCD display;

'incoming frame' refers to a frame into which incoming video data is written;

'line' 111 is used in the sense normally associated with a row of pixels on a typical video display device;

'ping' buffer 101 and 'pong' buffer 102 are dual-port RAM memory banks, each having the capacity sufficient to store a frame 112 of video data;

'write address' refers to the address in memory 101/102 to which incoming video data is written, and the term 'read address' similarly corresponds to the memory address from which the LCD display device 110 reads the video data to be displayed; and the term 'present memory bank' refers to the specific bank of memory containing the most recent frame of video data which was either written thereto or read therefrom, in accordance with the context in which the term is used.

Figure 1:
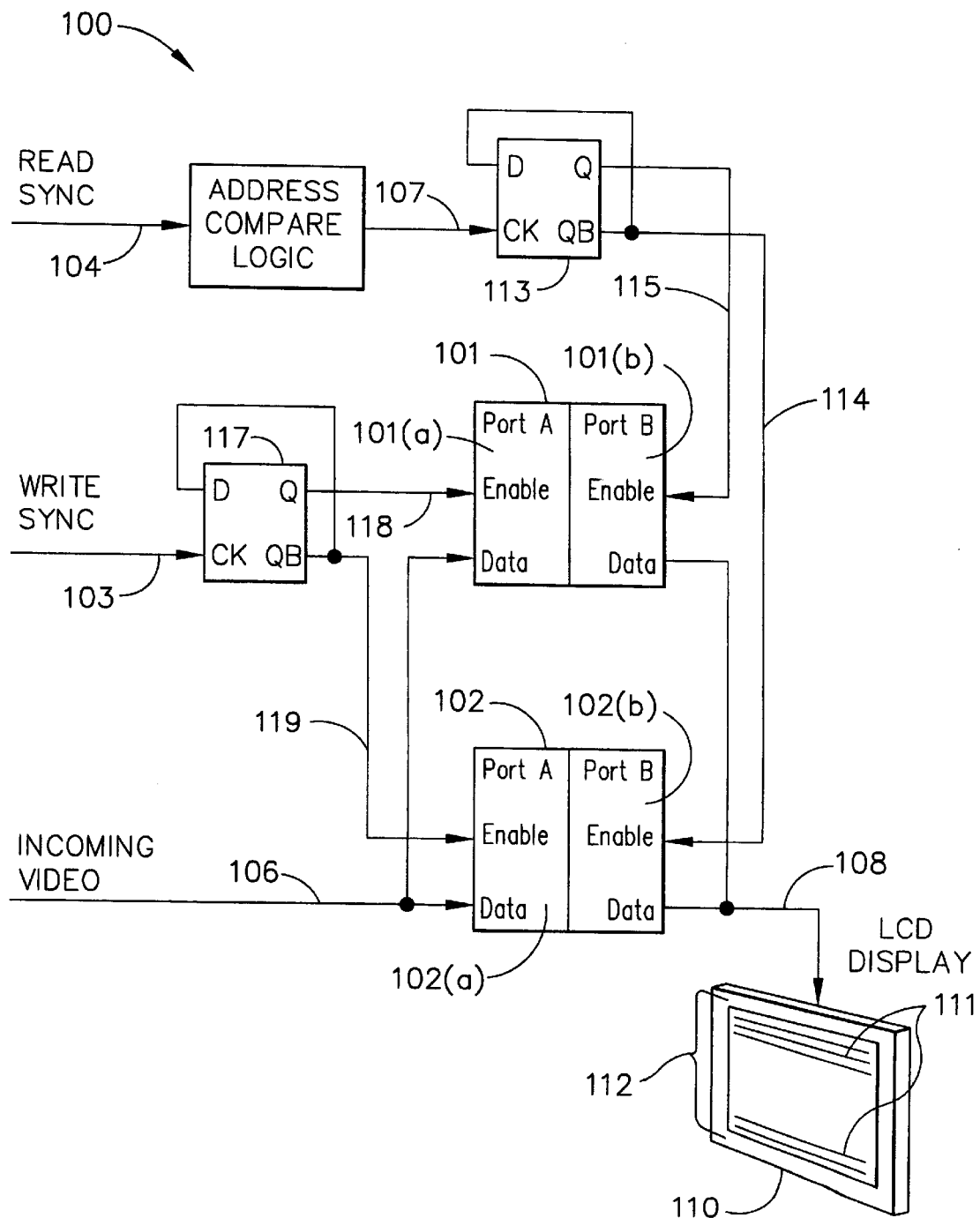
FIG. 1 is a diagram illustrating an exemplary implementation of the dual port memory buffering system of the present invention.
Figure 2:
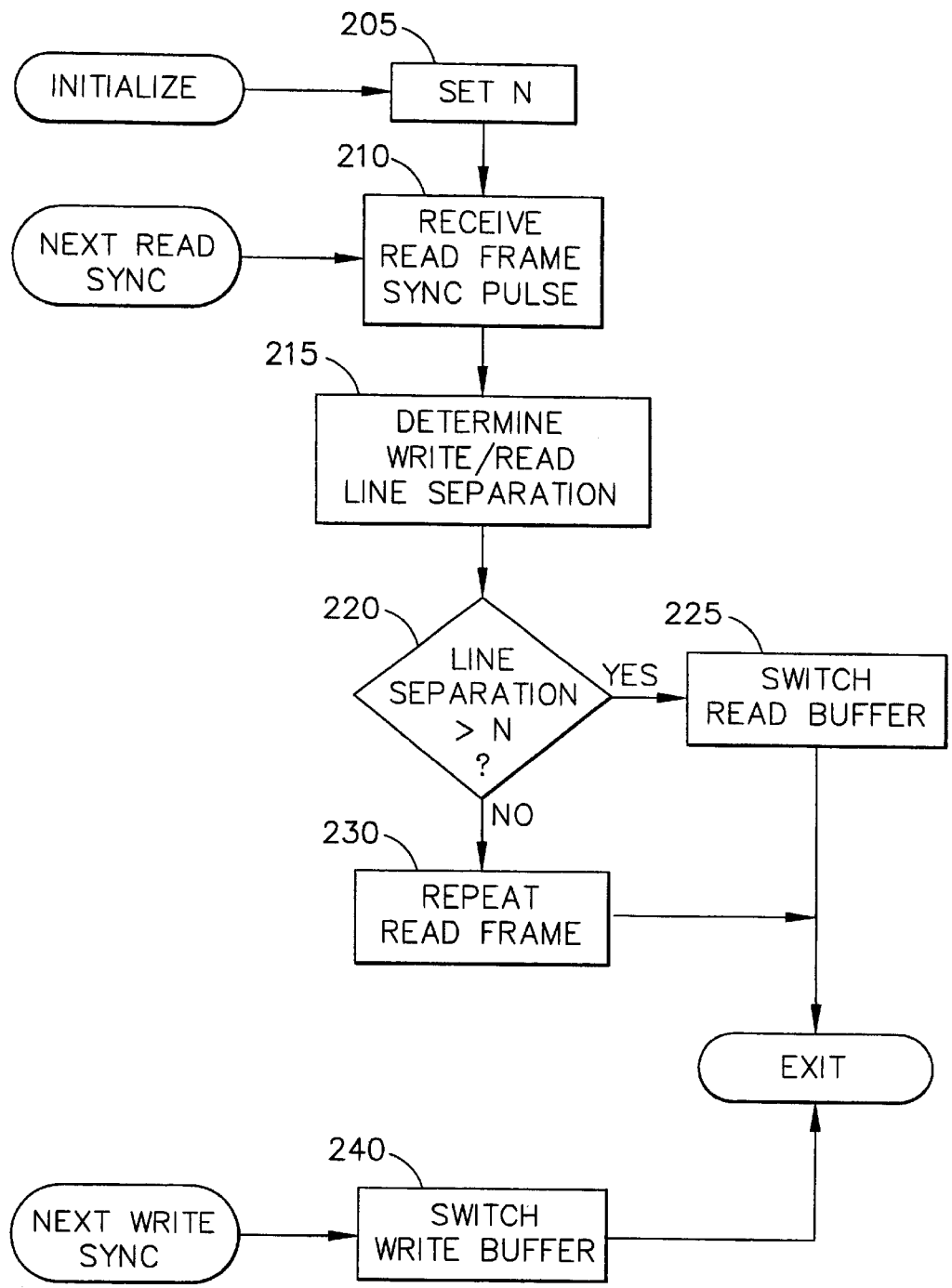
FIG. 2 is a diagram showing the basic operation of the present system.

FIG. 1 shows one exemplary embodiment of the dual-port memory system of the present invention. Although system 100 is described in the context of an LCD-type display 110, it is to be understood that the present system is functional with other types of raster display devices, such as plasma displays, field emission displays, or analog displays, such as CRTs, after digital-to-analog conversion of the digital video output 105. FIG. 2 is a flow diagram showing the steps performed by system 100 in order to avoid address crossover between write and read operations. The operation of system 100 is best understood in the context of FIGS. 1 and 2, taken together.

In accordance with the present invention, the incoming video frame write synchronization (herein after referred to as 'write sync') pulse 103 always causes the write buffer to be switched from the present memory bank to an alternate memory bank. As shown in FIG. 1, 'ping' memory bank 101 and 'pong' memory bank 102 are utilized as alternate buffers in the present exemplary embodiment. The present invention functions with conventional dual-port RAM memory as well as with serial dual-port RAMs which have internal address generators and separate read/write address reset lines. Serial dual-port RAMs are also known as dual-port 'FIFO' RAMs, which function as 'first-in-first-out' buffers. These serial dual-port RAMs use external address generators as 'repeaters' which mirror the internal address registers. Both the internal registers and the external address generators are cleared, as well as incremented, at the same time.

An LCD video frame read synchronization (hereinafter 'read sync') pulse 104 causes the LCD read operation to switch from the present memory bank to the alternate memory bank (i.e., from bank 101 to bank 102, or from bank 102 to bank 101) if the absolute value of the difference between the write and read addresses is greater than a predetermined threshold value D. If, however, the write/read address separation is less than threshold value D, the current frame 112 is re-read from the present memory bank 101/102. Threshold D is determined by taking the percentage of difference between the expected write and read rates, and multiplying the total number of lines in a frame 112 by this difference percentage.

As shown in FIG. 1, incoming frame video data is received via line 102, and sent to LCD display 110 via line 108. As shown in FIG. 2, at step 205, a value is set for N. When a read sync pulse 104 is received at step 210, address compare logic 105 then determines, at step 215, the separation D between the read and write addresses. Address compare logic 105 is connected to read and write address lines (not shown, for the purpose of clarity) on each memory bank 101/102.

At step 220, if the write/read address separation is greater than D lines, a 'switch read bank' (clock) signal is applied via line 107 to 'D' flip-flop 113. This switch bank signal toggles the output signal of flip-flop 113 from line 114 to line 115, or vice-versa, to enable the respective read port B 101(*b*) or 102(*b*) of the alternate memory bank 101/102. Therefore, video data for the next frame 112 is read from the alternate bank 101/102, at step 225. If the write/read address difference is not greater than D lines, then at step 230, the output of flip-flop 113 is not toggled, since no clock signal is output by address compare logic 105. Accordingly, the write address for the start of the next frame 112 automatically wraps back to the start of the present memory bank 101/102 and the existing video data in that bank is re-read to display the next frame 112.

Regardless of the write/read address separation, when a write sync pulse 103 is received by 'D' flip-flop 117, the output signal therefrom is toggled from line 118 to line 119, or vice-versa, to enable the respective write port A 101(*a*) or 102(*a*) of the alternate memory bank 101/102. Therefore, at step 240, video data for the next frame is written to the alternate bank 101/102.

Figure 3A:
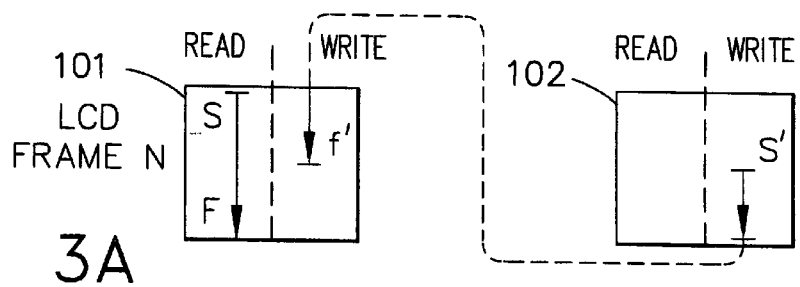
FIGS. 3A through 3E are diagrams showing the usage of two buffers for write and read operations when the incoming video data rate is faster than the LCD display rate.

FIGS. 3A through 3E illustrate the operation of the present dual-port memory configuration when the incoming video frame (write) rate is faster than the LCD frame (read) rate. As shown in FIG. 3A, for example, 'ping' buffer 101 and 'pong' buffer 102 are each divided into 'read' and 'write' columns in which a vertical line depicts either a read or write operation, respectively. Each read operation is delineated by the letters 's' and 'f', and each write operation is delineated by the letters 's'' and 'f'' which indicate the location of the respective read and write addresses at the start and finish of each LCD frame. It should be noted that these LCD frame start/finish addresses do not generally correspond to the start and finish of the incoming video frames. Furthermore, in each of the FIGS. 3A through 3E, the write operation shown in a given buffer (101 or 102) is for a frame subsequent to the LCD frame (if any) being read from the same buffer.

FIG. 3A shows video data being read for LCD frame N, while video data is being written for frames N+1 and N+2. When frame N is starting to be read from the top of 'ping' buffer 101, at the location indicated by the letter 's', half of incoming frame N+1 has been written to 'pong' buffer 102, as indicated at s'. Since the write and read operations are asynchronous, the write operation for incoming frame N+1 was initiated prior to s', which represents the memory location of the write operation occurring when the read operation started for LCD frame N. When LCD frame N is being read from the bottom of 'ping' buffer 101 at the finish of frame N, as indicated by the letter 'f', the incoming video data has completed filling 'pong' buffer 102 with frame N+1 and has also filled approximately two-thirds of 'ping' buffer 101 with frame N+2, at f'.

Figure 3B:
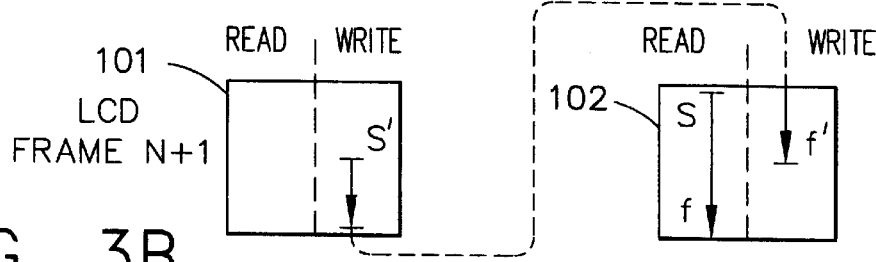
Figure 3C:
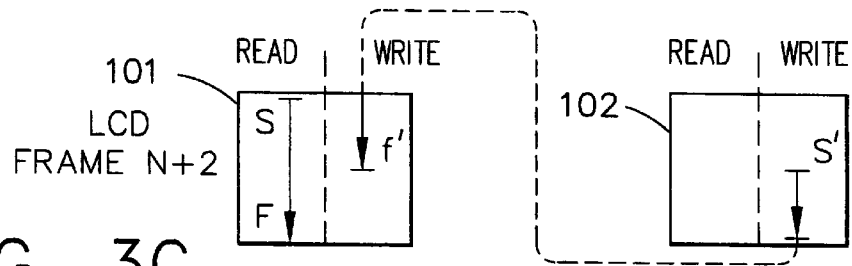
Figure 3D:
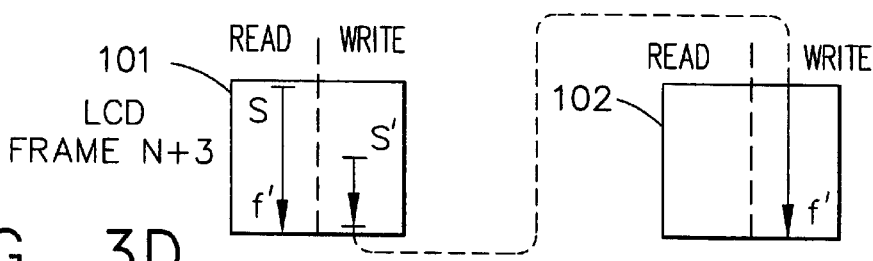
Figure 3E:
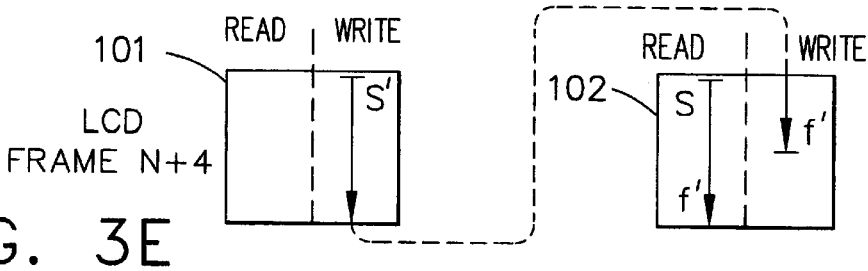

It can be seen from FIGS. 3A through 3C that, as each successive LCD frame is read, the incoming video write address more closely approaches the LCD read address, since the write operations are occurring faster than the read operations. As shown in FIG. 3C, by the time the read operation for frame N+2 is being completed, at 'f' in ping buffer 101, the incoming video write address (for frame N=4), at f', is about to overtake the LCD read address. It is assumed that at the completion of read frame N+2, in FIG. 3C, the incoming frame write address at location f' is within D lines of the LCD frame read address at location f. Therefore, as shown in FIG. 3D, at the start of frame N+3 the LCD frame read operation does not switch to 'pong' buffer 102, in the normal manner. Instead, in order to avoid address crossover, in LCD frame N+3 the data in 'ping' buffer 101 is re-read as the incoming video begins frame N+5 in 'pong' buffer 102. By repeating the previous LCD frame read, the incoming video write address is again sufficiently separated from the LCD read address. At frame N+4, as shown in FIG. 3E, both the incoming video write operations and the LCD read operations resume switching between memory banks 101/102 at each respective frame sync signal until the write/read address separation again dwindles to the minimum distance D. The procedure detailed above occasionally results in omitting a frame of video data to reestablish sufficient separation between read and write addresses.

A case which is analogous to that shown in FIG. 3 is one wherein the LCD frame reads are occurring faster than the incoming video writes. Again, read buffer 101(b)/102(b) repeats a frame when the write and read addresses become closer than D video lines. As a result, a frame of video data is occasionally repeated in order to maintain sufficient separation between read and write addresses.

It is to be understood that the claimed invention is not limited to the description of the preferred embodiment, but encompasses other modifications and alterations within the scope and spirit of the inventive concept. Although the system of the present invention has been described in the context of LCD-type displays, the present system could function with any type of display unit which receives video input asynchronously with respect to the display sync rate.

We claim:

1. A method for controlling the reading from and writing to dual-port memory used for storing digital video data to be displayed on a raster scanned video display device, the video data being written to a write address in said memory and being read from a read address in said memory, wherein the video data is received asynchronously with respect to the video frame display rate, and wherein said dual-port memory includes two memory banks which are alternate banks to one another, the method comprising the steps of:

receiving a read sync signal;

determining a separation between a present said read address and a present write address;

reading said video data for the next said frame from said alternate memory bank if said separation is greater than a predetermined number of lines;

re-reading said video data stored in a present one of said memory banks if said separation is not greater than a predetermined number of lines; and writing each successive said frame of said video data to said alternate bank after each write sync signal is received, wherein said present one of said memory banks contains a most recent frame of said video data.

2. The method of claim 1, wherein each of said memory banks has a storage capacity of at least one said frame of said video data.

3. The method of claim 1, wherein said video display device is selected from the group consisting of an LCD display, a plasma display, a field emission display, and a CRT display.

4. A system for controlling the reading from and writing to dual-port memory for storing digital video data to be displayed on a raster scanned video display device, the video data being written to a write address in said memory and being read from a read address in said memory, wherein the video data is received asynchronously with respect to the video frame display rate, the system comprising:

a first flip-flop having an input connected to a write sync signal source;

a second flip-flop;

two banks of dual-port memory, wherein a first output and a second output from said first flip-flop are connected to a write port enable input on a first one and a second one of said banks, respectively, and wherein a first output and a second output of said second flip-flop are connected to a read port enable input on a first one and a second one of said banks, respectively;

address compare logic having an input connected to a read sync signal source and to read address and write address lines on each of said banks, and having an output connected to a clock input of said second flip-flop, said output being an alternate buffer output signal generated in response to a simultaneous presence of said read sync signal and a predetermined separation between said read address and said write address;

wherein said display device is connected to a data output port of each of said banks;

wherein each occurrence of said write sync signal causes said first flip-flop to toggle an output signal between said write port enable input on said first one of said banks and said write port enable input on said second one of said banks, and wherein said alternate buffer signal causes said first flip-flop to toggle an output signal between said read port enable input on said first one of said banks and said read port enable input on said second one of said banks.

5. The system of claim 4, wherein each of said banks of dual port memory has a storage capacity of at least one said frame of said video data.

6. The system of claim 4, wherein said video display device is selected from the group consisting of an LCD display, a plasma display, a field emission display, and a CRT display.

7. A system for controlling the reading from and writing to dual-port memory for storing digital video data to be displayed on an LCD display, the video data being written to a write address in said memory and being read from a read address in said memory, wherein the video data is received asynchronously with respect to the LCD frame display rate, the system comprising:

two dual-port memory banks, each having a write port enable input and a read port enable input;

read sync indication means, responsive to a simultaneous presence of said read sync signal and a predetermined separation between said read address and said write address, for generating an alternate buffer signal indicating that said write address and said read address are separated by a predetermined distance;

first flip-flop means, responsive to a write sync signal, for toggling an output signal between said write port enable input on said first one of said banks and said write port enable input on said second one of said banks;

second flip-flop means, responsive to said alternate buffer signal, for toggling an output signal between said read port enable input on said first one of said banks and said read port enable input on said second one of said banks.

8. The system of claim 7, wherein each of said dual-port memory banks has a storage capacity of one said frame of said video data.

9. The system of claim 7, wherein said video display device is selected from the group consisting of an LCD display, a plasma display, a field emission display, and a CRT display.

* * * * *